(12) United States Patent
Minemura

(10) Patent No.: US 11,171,149 B2
(45) Date of Patent: Nov. 9, 2021

(54) SEMICONDUCTOR STORAGE DEVICE WITH THREE DIMENSIONAL MEMORY CELL ARRAY

(71) Applicant: Toshiba Memory Corporation, Minato-ku (JP)

(72) Inventor: Yoichi Minemura, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 44 days.

(21) Appl. No.: 16/565,588

(22) Filed: Sep. 10, 2019

(65) Prior Publication Data

US 2020/0303396 A1 Sep. 24, 2020

(30) Foreign Application Priority Data

Mar. 18, 2019 (JP) .............................. JP2019-050388

(51) Int. Cl.
| | |
|---|---|
| H01L 27/11 | (2006.01) |
| H01L 27/11578 | (2017.01) |
| H01L 27/11565 | (2017.01) |
| H01L 27/11568 | (2017.01) |
| H01L 27/11526 | (2017.01) |
| H01L 27/11519 | (2017.01) |
| H01L 27/11521 | (2017.01) |
| H01L 27/11573 | (2017.01) |

(52) U.S. Cl.
CPC .. *H01L 27/11578* (2013.01); *H01L 27/11519* (2013.01); *H01L 27/11521* (2013.01); *H01L 27/11526* (2013.01); *H01L 27/11565* (2013.01); *H01L 27/11568* (2013.01); *H01L 27/11573* (2013.01)

(58) Field of Classification Search
CPC ......... H01L 27/11582; H01L 27/11578; H01L 27/11565; H01L 27/11568; H01L 27/11526; H01L 27/11519; H01L 27/11521; H01L 27/11573; H01L 27/11575; G11C 16/24; G11C 16/10; G11C 16/0483; G11C 16/32; G11C 16/08
USPC ........................................................ 257/324
See application file for complete search history.

(56) References Cited

U.S. PATENT DOCUMENTS

| | | | |
|---|---|---|---|
| 9,019,739 B2 | 4/2015 | Park et al. | |
| 9,460,805 B1 * | 10/2016 | Pang | ...................... G11C 16/10 |
| 9,887,273 B2 * | 2/2018 | Ishida | ............... H01L 23/53271 |
| 9,892,930 B1 * | 2/2018 | Sawa | .................... H01L 23/528 |

(Continued)

FOREIGN PATENT DOCUMENTS

| | | |
|---|---|---|
| JP | 2017-163057 A | 9/2017 |
| JP | 2018-156969 A | 10/2018 |

*Primary Examiner* — Mohammad M Hoque
(74) *Attorney, Agent, or Firm* — Oblon, McClelland, Maier & Neustadt, L.L.P.

(57) ABSTRACT

According to one embodiment, in a semiconductor storage device, the first contact plug electrically connects the third region to the first drive circuit. The second contact plug is provided on one end side of a fourth region in the third direction, the fourth region arranged between the first separation film and the second separation film in the second conductive layer. The second contact plug electrically connects the fourth region to the first drive circuit. The third contact plug is provided on the other end side of the third region in the third direction. The third contact plug electrically connects the third region to the second drive circuit.

20 Claims, 9 Drawing Sheets

(56) References Cited

U.S. PATENT DOCUMENTS

| | | | |
|---|---|---|---|
| 9,922,991 B2* | 3/2018 | Kamigaki | H01L 21/76877 |
| 9,960,173 B2 | 5/2018 | Shimojo | |
| 2012/0052674 A1* | 3/2012 | Lee | H01L 29/7926 |
| | | | 438/591 |
| 2014/0047167 A1* | 2/2014 | Kwak | G11C 16/10 |
| | | | 711/103 |
| 2016/0260731 A1* | 9/2016 | Nagai | H01L 21/76805 |
| 2016/0268268 A1* | 9/2016 | Kobayashi | H01L 27/11582 |
| 2016/0268291 A1* | 9/2016 | Ishimura | H01L 27/11582 |
| 2017/0213840 A1* | 7/2017 | Sudo | H01L 27/11582 |
| 2017/0236834 A1* | 8/2017 | Fukumura | H01L 27/11582 |
| | | | 257/314 |
| 2017/0263612 A1* | 9/2017 | Yamashita | H01L 27/115 |
| 2017/0309638 A1* | 10/2017 | Nagumo | H01L 23/5283 |
| 2018/0076215 A1* | 3/2018 | Nishimura | H01L 27/1157 |
| 2018/0269224 A1 | 9/2018 | Shimizu | |
| 2019/0088331 A1 | 3/2019 | Kobayashi et al. | |

* cited by examiner

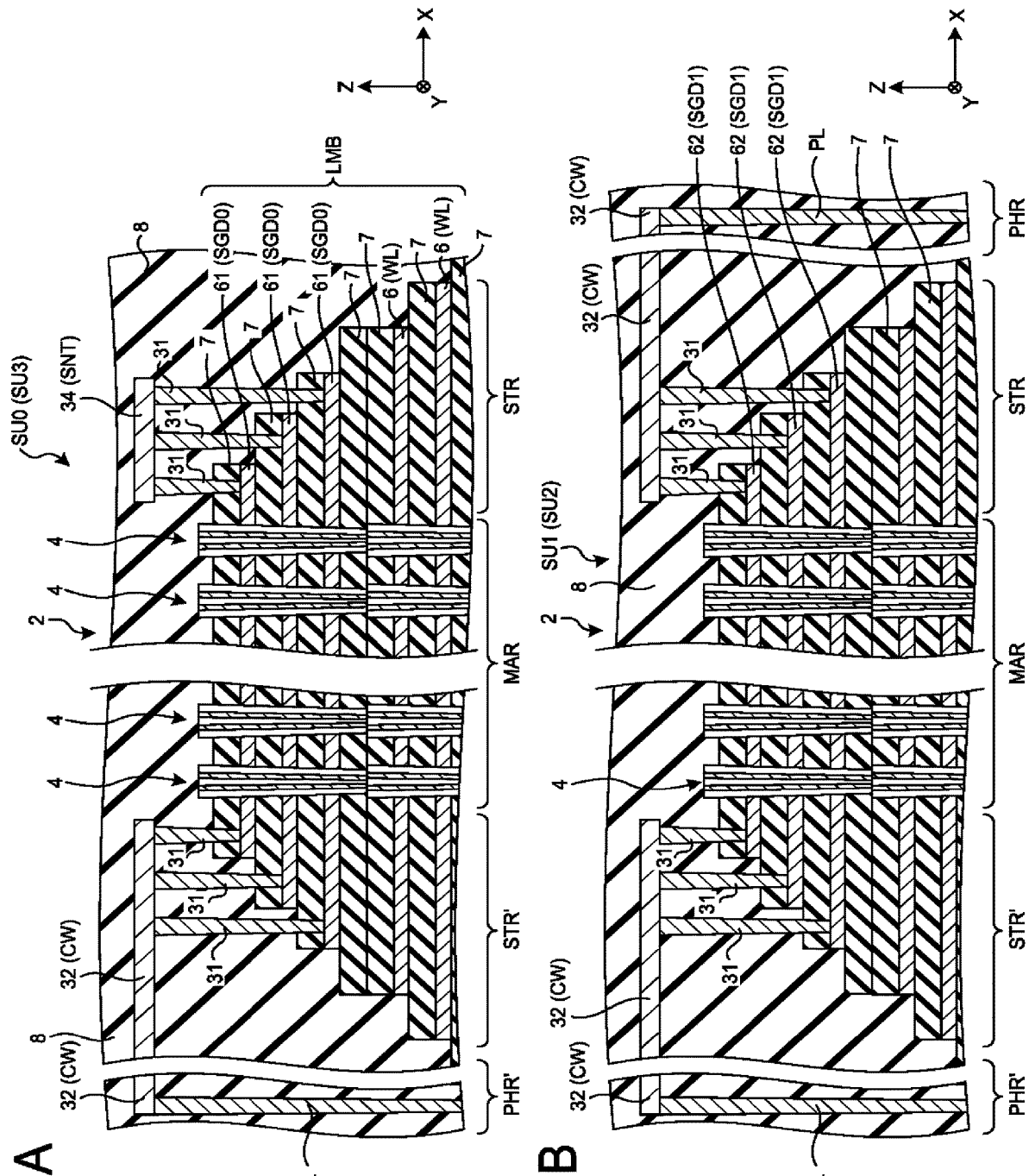

SEMICONDUCTOR STORAGE DEVICE WITH THREE DIMENSIONAL MEMORY CELL ARRAY

CROSS-REFERENCE TO RELATED APPLICATIONS

This application is based upon and claims the benefit of priority from Japanese Patent Application No. 2019-050388, filed on Mar. 18, 2019; the entire contents of which are incorporated herein by reference.

FIELD

Embodiments described herein relate generally to a semiconductor storage device.

BACKGROUND

In a semiconductor storage device having a three-dimensional structure, a plurality of conductive layers is stacked, a semiconductor channel penetrates in a stacking direction thereof, and a memory cell is placed at a position at which each conductive layer and the semiconductor channel cross. In a method in which, among those conductive layers, a conductive layer functioning as a selection gate line is further divided to be individually selected, an operating characteristic is different depending on the divided conductive layer, and, as a result, the whole operating characteristic is deteriorated in some cases.

BRIEF DESCRIPTION OF THE DRAWINGS

FIGS. 7A and 7B are cross-sectional views illustrating the configuration of the memory cell array included in the semiconductor storage device according to the first embodiment;

DETAILED DESCRIPTION

Figure 1:
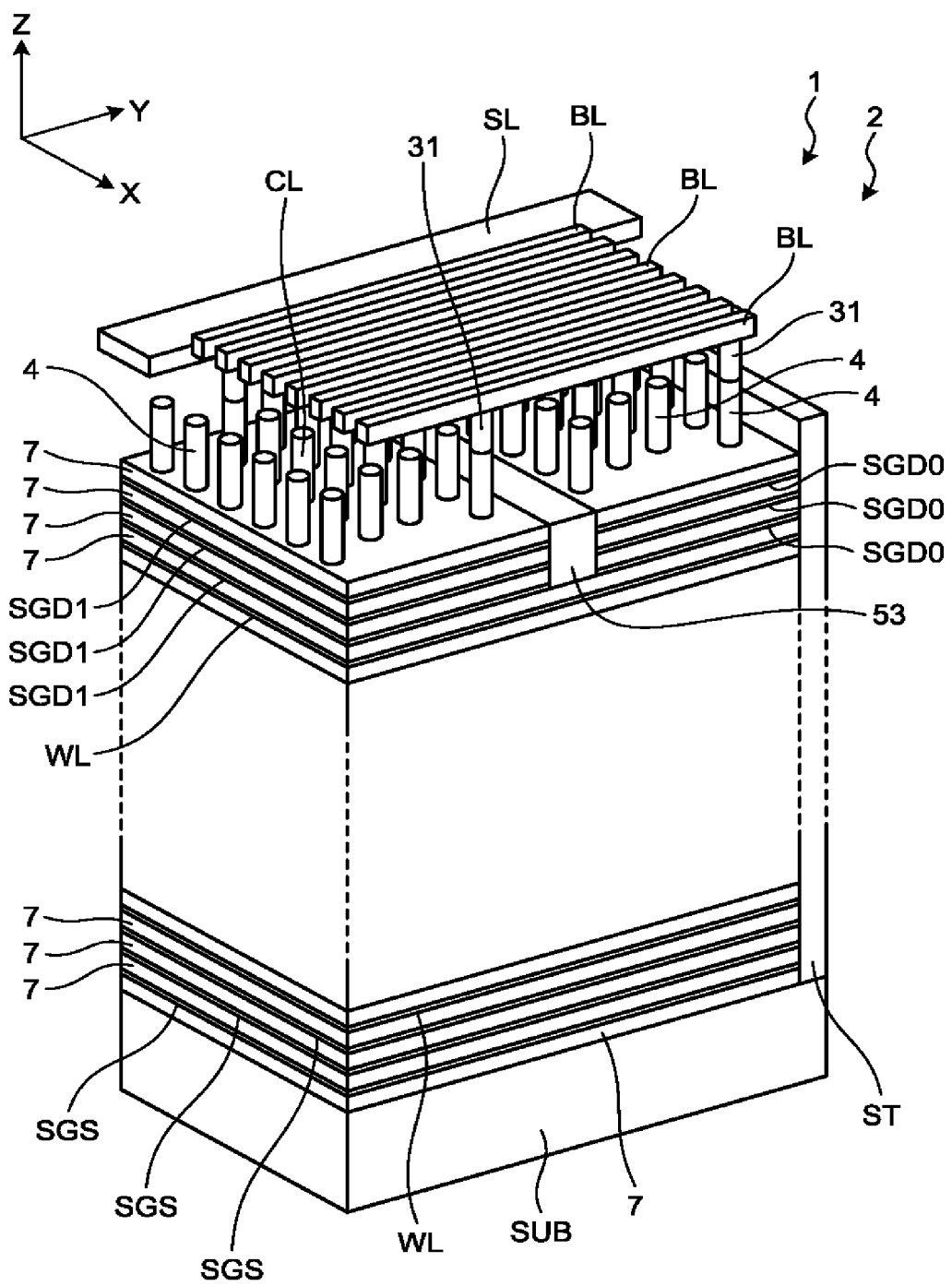
FIG. 1 is a perspective view illustrating a configuration of a semiconductor storage device according to a first embodiment.

In general, according to one embodiment, there is provided a semiconductor storage device including a plurality of first conductive layers, a second conductive layer, a plurality of first separation films, a plurality of second separation films, a first semiconductor pillar, a second semiconductor pillar, a first charge storage layer, a second charge storage layer, a first drive circuit, a second drive circuit, a first contact plug, a second contact plug, and a third contact plug. The plurality of first conductive layers are stacked in a first direction. The second conductive layer is placed in the first direction with respect to the plurality of first conductive layers. The plurality of first separation films separates the plurality of first conductive layers and the second conductive layer in a second direction crossing the first direction. The plurality of first separation films extends in the first direction and a third direction crossing the first direction and the second direction. The plurality of second separation films separates, in the second direction, a region between the first separation films adjacent to each other in the second conductive layer. The plurality of second separation films extends in the first direction and the third direction. The first semiconductor pillar extends in the first direction in a first region arranged between the second separation films adjacent to each other in the first conductive layer. The second semiconductor pillar extends in the first direction in a second region arranged between the first and second separation films adjacent to each other in the first conductive layer. The first charge storage layer is placed between the first semiconductor pillar and the first region. The second charge storage layer is placed between the second semiconductor pillar and the second region. The first drive circuit is provided on one end side of the second conductive layer in the third direction. The second drive circuit is provided on the other end side of the second conductive layer in the third direction. The first contact plug is provided on one end side of a third region in the third direction, the third region arranged between the second separation films in the second conductive layer. The first contact plug electrically connects the third region to the first drive circuit. The second contact plug is provided on one end side of a fourth region in the third direction, the fourth region arranged between the first separation film and the second separation film in the second conductive layer. The second contact plug electrically connects the fourth region to the first drive circuit. The third contact plug is provided on the other end side of the third region in the third direction. The third contact plug electrically connects the third region to the second drive circuit.

Hereinafter, embodiments will be described with reference to the drawings. The same portions in the drawings are denoted by the same numbers, and detailed description thereof will be omitted as appropriate, and different portions will be described. Note that the drawings are schematic or conceptual, and relationships between thicknesses and widths of portions, proportions of sizes among portions, and the like are not necessarily the same as actual values thereof. Further, dimensions and proportions of the same portions may be illustrated differently among the drawings.

First Embodiment

FIG. 1 is a perspective view schematically illustrating a configuration of a memory cell array 2 included in a semiconductor storage device 1 according to a first embodiment. The semiconductor storage device 1 is a NAND nonvolatile memory including three-dimensionally arranged memory cells.

In the following description, as illustrated in FIG. 1 and the like, directions orthogonal to each other in a plane in parallel to a surface of a semiconductor substrate SUB are defined as an X direction and a Y direction. More specifically, the X direction is a direction in which word lines WL extend, and the Y direction is a direction in which bit lines BL extend. A Z direction is defined as a direction orthogonal to the semiconductor substrate SUB. Therefore, the Z direction is orthogonal to the X direction and the Y direction.

As illustrated in FIG. 1, the semiconductor storage device 1 includes selection gates SGS, the word lines WL, and selection gates SGD. The selection gates SGS are stacked on the semiconductor substrate SUB via interlayer insulating films 7. In the example of FIG. 1, three selection gates SGS are provided. The word lines WL are stacked on the top selection gate SGS via the interlayer insulating films 7. In the example of FIG. 1, eight word lines WL are provided. The selection gates SGD mean a plurality of divided selection gates included in the same layer. The example of FIG. 1 illustrates selection gates SGD0 and SGD1 divided in the Y direction. The selection gates SGD are stacked on the top word line WL via the interlayer insulating films 7. The selection gates SGS, the word lines WL, and the selection gates SGD each have a plate shape extending in the X direction and the Y direction.

In the example of FIG. 1, the selection gates SGD, the word lines WL, and the selection gates SGS are separated in the Y direction by a slit ST and are therefore insulated. The slit ST is provided on the semiconductor substrate SUB and extends in the X direction and the Z direction.

The selection gates SGD are, for example, separated in the Y direction by an insulating film 53. The insulating film 53 is provided above the word lines WL (on a +Z side) and extends in the X direction and the Z direction. Therefore, the selection gates SGD0 and the selection gates SGD1 are placed side by side in the Y direction above the word lines WL. In the example of FIG. 1, three selection gates SGD0 and three selection gates SGD1 are provided.

The semiconductor substrate SUB is, for example, a silicon substrate. The selection gates SGS, the word lines WL, and the selection gates SGD are, for example, metal layers containing tungsten (W). The interlayer insulating films 7 and the insulating film 53 are, for example, insulators containing silicon oxide.

The semiconductor storage device 1 further includes a plurality of columnar bodies 4. The columnar bodies 4 penetrate the selection gates SGS, the word lines WL, and the selection gates SGD and extend in the Z direction serving as a stacking direction thereof. The semiconductor storage device 1 further includes a plurality of bit lines BL and a source line SL provided above the selection gates SGD.

The columnar bodies 4 are electrically connected to the bit lines BL via contact plugs 31, respectively. For example, one of the columnar bodies 4 sharing the selection gates SGD0 and one of the columnar bodies 4 sharing the selection gates SGD1 are electrically connected to a single bit line BL.

Note that FIG. 1 does not illustrate an interlayer insulating film provided between the selection gates SGD and the bit lines BL for simplicity of the drawing. Further, in the first embodiment, four selection gates are provided as the selection gates SGD between adjacent slits ST. Therefore, selection gates SGD3 and selection gates SGD4 are further placed via the insulating film 53 on a −Y side of the selection gates SGD1 in FIG. 1.

In a case of a semiconductor storage device (memory) having a three-dimensional structure such as the semiconductor storage device 1, the memory cell array 2 is configured so that portions at which the word lines WL and the columnar bodies 4 cross function as memory cells and a plurality of memory cells is three-dimensionally arrayed. Further, portions at which the selection gates SGS and the columnar bodies 4 cross function as selection gates on a source side, and portions at which the selection gates SGD0 and SGD1 and the columnar bodies 4 cross serve as selection gates on a drain side. In the semiconductor storage device 1, by increasing the number of stacking of the word lines WL in a stacked body, it is possible to increase a storage capacity without using a finer patterning technology.

Figure 2:
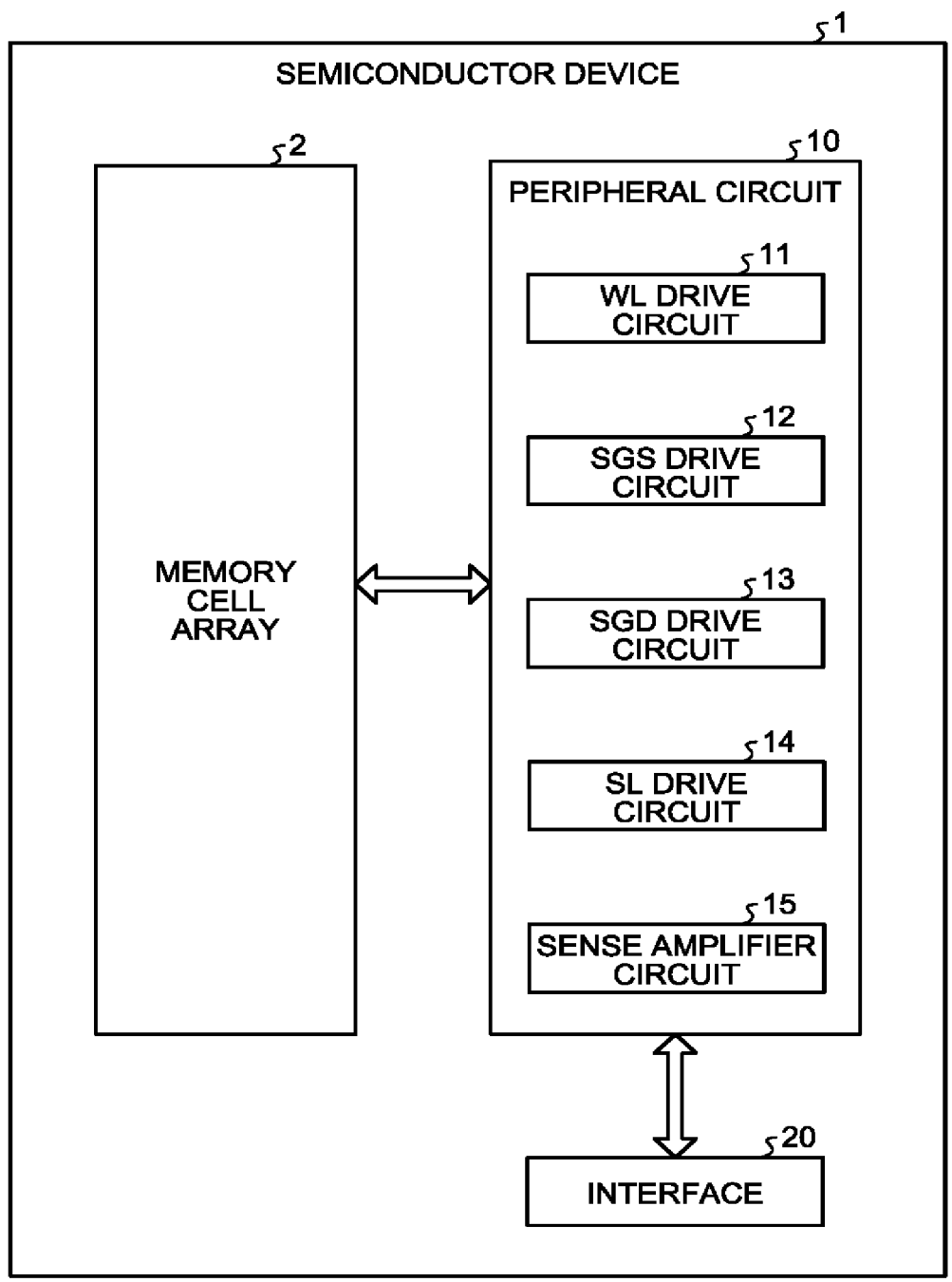
FIG. 2 is a block diagram illustrating the configuration of the semiconductor storage device according to the first embodiment.

FIG. 2 is a block diagram illustrating a configuration of the semiconductor storage device 1.

As illustrated in FIG. 2, the semiconductor storage device 1 includes the memory cell array 2, a peripheral circuit 10, and an interface 20. The peripheral circuit 10 includes a WL drive circuit 11, an SGS drive circuit 12, an SGD drive circuit 13, an SL drive circuit 14, and a sense amplifier circuit 15.

The WL drive circuit 11 is a circuit that controls a voltage to be applied to the word lines WL, and the SGS drive circuit 12 is a circuit that controls a voltage to be applied to the selection gates SGS. The SGD drive circuit 13 is a circuit that controls a voltage to be applied to the selection gates SGD, and the SL drive circuit 14 is a circuit that controls a voltage to be applied to the source line SL. The sense amplifier circuit 15 is a circuit that determines data that has been read in response to a signal from a selected memory cell.

The peripheral circuit 10 controls operation of the semiconductor storage device 1 on the basis of an instruction input from the outside (for example, a memory controller of a memory system to which the semiconductor storage device 1 is applied) via the interface 20. For example, in a case where the peripheral circuit 10 receives a writing instruction, the peripheral circuit 10 selects a memory cell having an address specified by the writing instruction by using the SGS drive circuit 12, the SGD drive circuit 13, and the WL drive circuit 11 and applies a voltage based on data to the selected memory cell, thereby performing writing. Further, in a case where the peripheral circuit 10 receives a reading instruction, the peripheral circuit 10 selects a memory cell having a specified address in the memory cell array 2 by using the SGS drive circuit 12, the SGD drive circuit 13, and the WL drive circuit 11, determines, in the sense amplifier circuit 15, data that has been read in response to a signal from the selected memory cell, and outputs the data to the outside (memory controller) via the interface 20.

Figure 3:
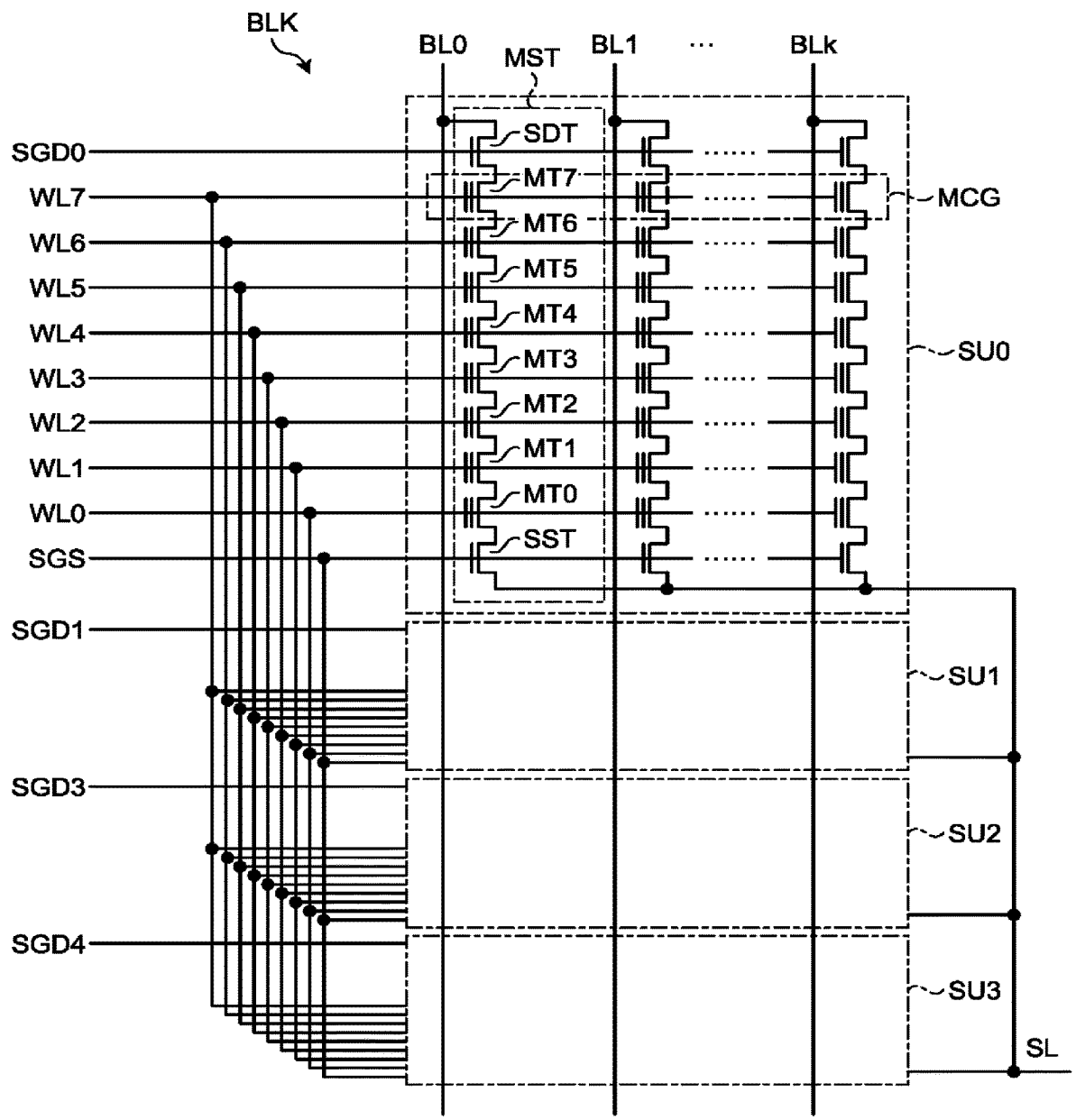
FIG. 3 is a circuit diagram illustrating a configuration of a memory cell array included in the semiconductor storage device according to the first embodiment.

Next, a configuration of the memory cell array 2 will be described with reference to FIG. 3. FIG. 3 is a circuit diagram illustrating the configuration of the memory cell array 2 included in the semiconductor storage device 1.

The memory cell array 2 includes a plurality of blocks BLK each of which is an aggregation of a plurality of memory cell transistors MT. Each block BLK includes a plurality of string units SU0, SU1, SU2, and SU3 that is aggregations of the memory cell transistors MT associated with the word lines WL and the bit lines BL. Each of the string units SU0 to SU3 includes a plurality of memory strings MST in which the memory cell transistors MT are connected in series. Note that the number of memory strings MST in the string units SU0 to SU3 is arbitrary.

The plurality of string units SU0, SU1, SU2, and SU3 corresponds to a plurality of selection gates SGD0, SGD1, SGD3, and SGD4, shares the selection gates SGS, and functions as a plurality of drive units in the block BLK. Each string unit SU can be driven by the corresponding selection gates SGD and selection gates SGS. Further, each string unit SU includes a plurality of memory strings MST.

Each memory string MST includes, for example, eight memory cell transistors MT (MT0 to MT7) and selection transistors SDT and SST. Each memory cell transistor MT includes a control gate and a charge storage layer and holds data in a nonvolatile manner. Further, the eight memory cell transistors MT (MT0 to MT7) are connected in series between a source of the selection transistor SDT and a drain of the selection transistor SST. Note that the number of the memory cell transistors MT in the memory string MST is not limited to eight.

Gates of the selection transistors SDT in each string unit SU are connected to the selection gates SGD, respectively. Meanwhile, gates of the selection transistor SST in each string unit SU are connected to, for example, the selection gates SGS in common.

Drains of the selection transistors SDT of the respective memory strings MST in each string unit SU are connected to different bit lines BL0 to BLk (k is an arbitrary integer of 2 or more), respectively. Further, each of the bit lines BL0 to BLk connects a single memory string MST in each string unit SU in common among the plurality of blocks BLK. Further, sources of the respective selection transistors SST are connected to the source line SL in common.

In other words, the string unit SU is an aggregation of the memory strings MST connected to the different bit lines BL0 to BLk and connected to the same selection gate SGD. Further, the block BLK is an aggregation of the plurality of string units SU0 to SU3 having the common word lines WL. Further, the memory cell array 2 is an aggregation of the plurality of blocks BLK having the common bit lines BL0 to BLk.

Note that, in a case where a group of the memory cell transistors MT sharing the word lines WL is referred to as "memory cell group MCG", the memory cell group MCG is a minimum unit of an aggregation of memory cells to which a predetermined voltage (for example, writing voltage and reading voltage) is collectively applicable via the word lines WL.

Figure 4:
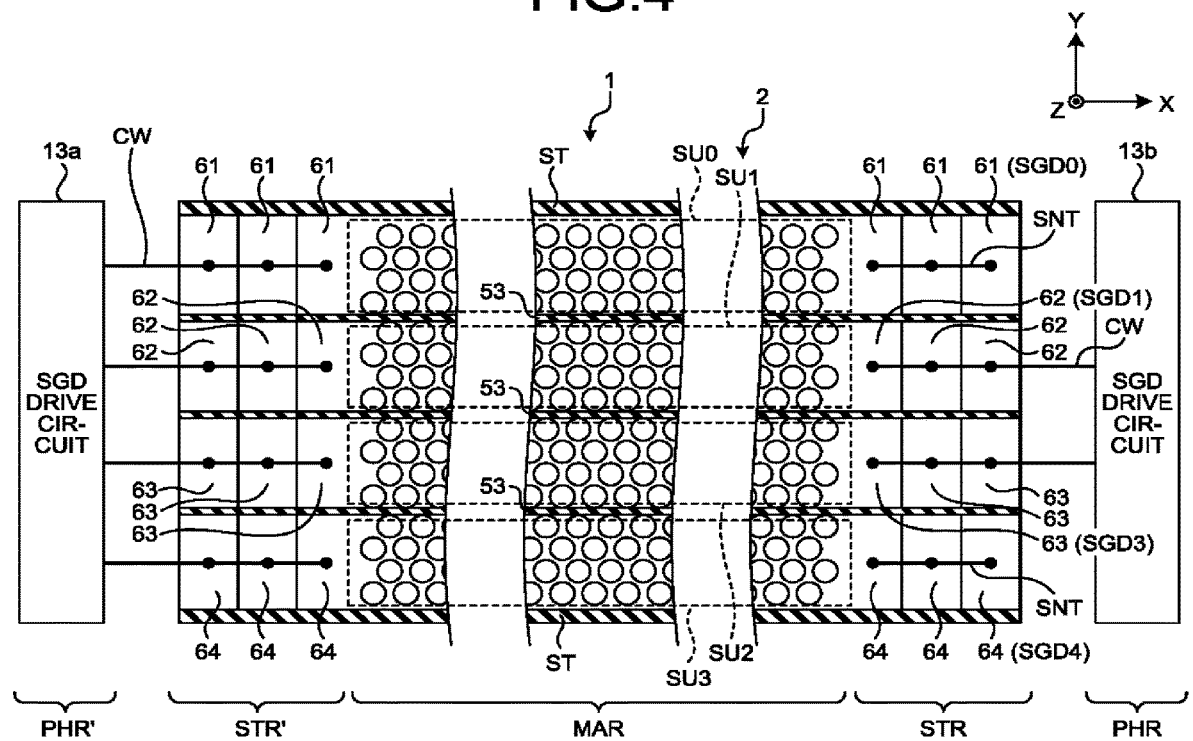
FIG. 4 illustrates driving of the memory cell array included in the semiconductor storage device according to the first embodiment.
Figure 5:
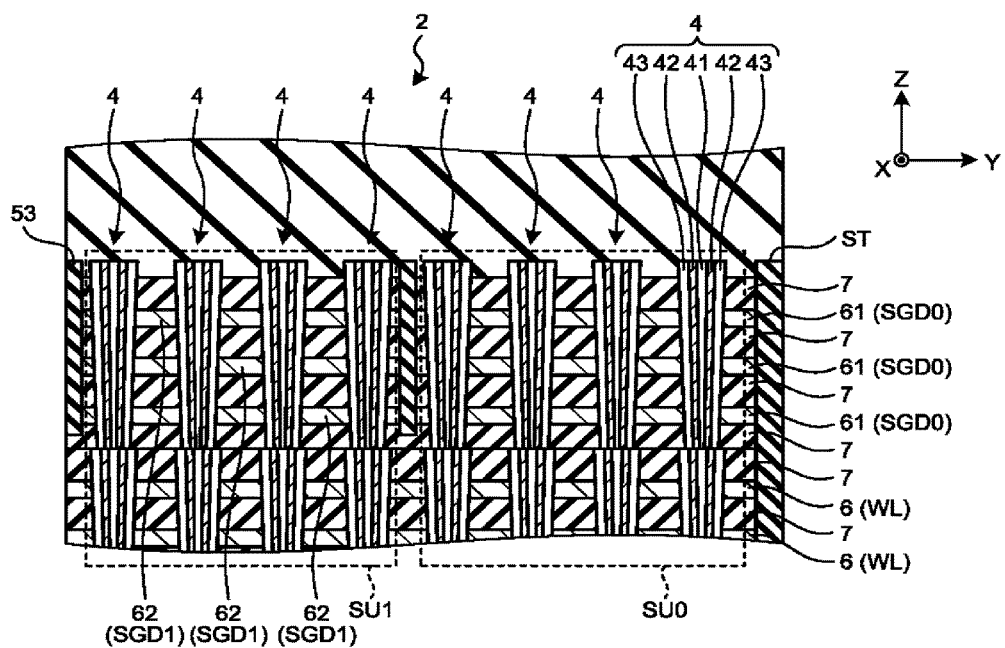
FIG. 5 is a cross-sectional view illustrating a configuration of the memory cell array included in the semiconductor storage device according to the first embodiment.
Figure 6:
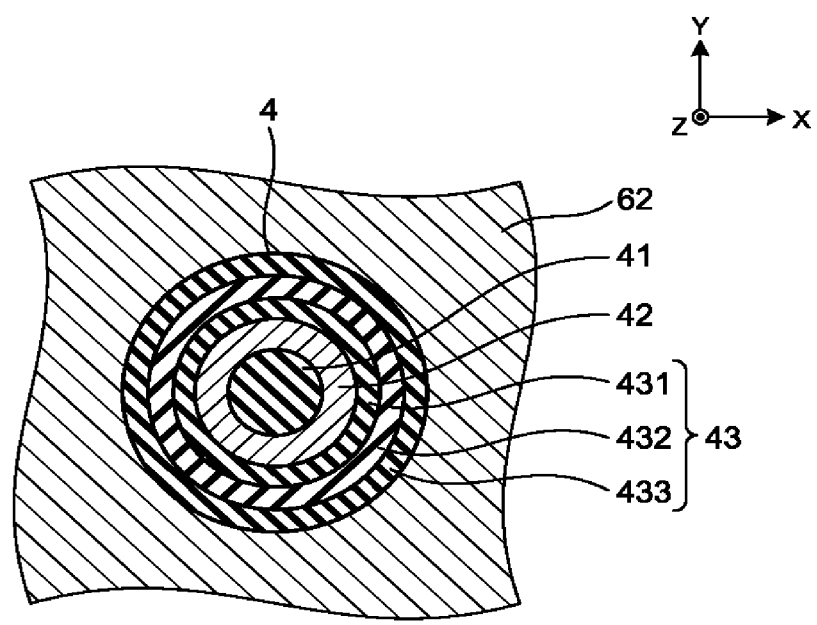
FIG. 6 is a plan view illustrating the configuration of the memory cell array included in the semiconductor storage device according to the first embodiment.

Next, a specific configuration of the memory cell array 2 will be described with reference to FIGS. 4 to 7B. FIG. 4 illustrates driving of the memory cell array 2 included in the semiconductor storage device 1 according to the first embodiment. FIG. 5 is a ZY cross-sectional view illustrating the configuration of the memory cell array 2 included in the semiconductor storage device 1 according to the first embodiment. FIG. 6 is an XY plan view illustrating the configuration of the memory cell array 2 included in the semiconductor storage device 1 according to the first embodiment. FIGS. 7A and 7B are ZX cross-sectional views illustrating the configuration of the memory cell array 2 included in the semiconductor storage device 1 according to the first embodiment.

As illustrated in FIGS. 4 to 7B, the memory cell array 2 is configured as an array of three-dimensional memory cells in which, on a +Z side of the semiconductor substrate SUB, the columnar bodies 4 are two-dimensionally arrayed in an XY direction and the plurality of word lines WL is penetrated by the columnar bodies 4.

As illustrated in FIG. 4, the plurality of columnar bodies 4 is placed to form, for example, sixteen lanes in an XY plan view. Each lane extends in the X direction and is arrayed in the Y direction. In adjacent lanes of the sixteen lanes in the Y direction, placement positions of the columnar bodies 4 are shifted from each other at a substantially half pitch of a placement pitch thereof in the X direction. In the XY plan view, the plurality of columnar bodies 4 can also be considered to be arrayed in zigzag. Each columnar body 4 includes the plurality of memory transistors MT placed in the Z direction. That is, an array of the plurality of columnar bodies 4 in the XY direction and an array of the plurality of memory transistors MT in the Z direction in each columnar body 4 form a three-dimensional array of the plurality of memory transistors MT and an array of the plurality of selection transistors SDT.

Among the plurality of three-dimensionally arrayed memory transistors MT, the plurality of memory transistors MT forming sixteen lanes at substantially the same Z coordinate shares, for example, conductive layers 6 serving as the word lines WL and can receive the same control voltage (program voltage) from the peripheral circuit 10.

Further, the plurality of selection transistors SDT is placed on a +Z side of the plurality of memory transistors MT0 to MT7 and is grouped in the unit of four lanes. That is, each conductive layer serving as the selection gate SGD is divided (separated) into a plurality of drive electrode films 61 to 64 by the insulating films (second separation films) 53 having a substantially plate shape (substantially fin shape) extending in an XZ direction. Among the plurality of two-dimensionally or three-dimensionally arrayed selection transistors SDT, the selection transistors SDT in four lanes at substantially the same Z coordinate share, for example, a drive electrode film serving as the selection gate SGD and receives the same control voltage (drive voltage) from the peripheral circuit 10.

In accordance with this, the array of the plurality of memory transistors MT is grouped in the unit of four lanes as the string units SU0 to SU3. That is, each of the string units SU0 to SU3 functions as a unit driven by the drive electrode film in a block BLK0. That is, each of the string units SU0 to SU3 includes the selection transistors SDT in four lanes, the memory transistors MT0 to MT63 in four lanes, and the selection transistors SST in four lanes (see FIG. 3).

Among the plurality of string units SU0 to SU3 in the memory cell array 2, the string units SU0 and SU3 near the slit ST are referred to as "outer string units SU0 and SU3", and the string units SU1 and SU2 far from the slit ST are referred to as "inner string units SU1 and SU2". The outer string units SU0 and SU3 can be considered to be string units that are in contact with the slit ST, and the inner string units SU1 and SU2 can be considered to be string units that are not in contact with the slit ST.

In the memory cell array 2, the conductive layers 6 and the insulating layers 7 are alternately and repeatedly stacked, and, in addition, the drive electrode films 61 to 64 and the insulating layer 7 are alternately and repeatedly stacked. Each conductive layer 6 can be made from a material containing a conductive substance (for example, metal such as tungsten) as a main component. Each insulating layer 7 can be made from a material containing an insulating substance (for example, semiconductor oxide such as silicon oxide) as a main component. The conductive layer 6 functions as the word line WL. The drive electrode films 61 to 64 can be made from a material containing a conductive substance (for example, metal such as tungsten) as a main component. The drive electrode film 61 functions as the selection gate SGD0, the drive electrode film 62 functions as the selection gate SGD1, the drive electrode film 63 functions as the selection gate SGD2, and the drive electrode film 64 functions as the selection gate SGD3.

Further, in the memory cell array 2, each columnar body 4 includes a core insulating film 41, a semiconductor channel 42, and an insulating film 43. The core insulating film 41 can be made from a material containing an insulating substance (for example, silicon oxide) as a main component. The semiconductor channel 42 is placed to surround the core insulating film 41 and has a substantially cylindrical shape extending along a central axis of the columnar body 4.

The semiconductor channel 42 has a channel region (active region) in the memory string MST and can be made from a material containing a semiconductor that substantially contains no impurities (for example, polysilicon) as a main component.

The insulating film 43 is placed between the drive electrode films 61 to 64 or the conductive layer 6 (word line WL) and the semiconductor channel 42 and surrounds the semiconductor channel 42 in a plan view. The insulating film 43 covers a side surface of the semiconductor channel 42. The insulating film 43 is configured to have a charge storage capacity at portions placed between the conductive layers 6 (word lines WL) and the semiconductor channel 42. As illustrated in FIG. 6, the insulating film 43 can be configured to have a three-layer structure of a tunnel insulating film 431, a charge storage film 432, and a block insulating film 433 in order from the semiconductor channel 42 side. The tunnel insulating film 431 can be made from a material containing oxide (for example, silicon oxide) as a main component. The charge storage film 432 can be made from a material containing nitride (for example, silicon nitride) as a main component. The block insulating film 433 can be made from a material containing oxide (for example, silicon oxide, metal oxide, or a stack thereof) as a main component. That is, the insulating film 43 may have an ONO-type three-layer structure in which a charge storage film is sandwiched between a pair of insulating films (tunnel insulating film and block insulating film) at the portions placed between the conductive layers 6 (word lines WL) and the semiconductor channel 42. Further, the insulating film 43 may be configured to have a single-layer structure of a gate insulating film at portions placed between the drive electrode films 61 to 64 and the semiconductor channel 42. The gate insulating film can be made from a material containing oxide (for example, silicon oxide) as a main component.

As illustrated in FIGS. 7A and 7B, the semiconductor storage device 1 has a memory cell array region MAR, has a stepwise region STR on a +X side of the memory cell array region MAR, and has a stepwise region STR' on an −X side of the memory cell array region MAR. In each of the stepwise regions STR and STR', the drive electrode films 61 to 64 each are extracted stepwise.

Further, as illustrated in FIG. 4, an SGD drive circuit 13a that is a part of the SGD drive circuit 13 (see FIG. 2) is placed in a peripheral circuit region PHR' on an −X side of the stepwise region STR', and an SGD drive circuit 13b that is another part of the SGD drive circuit 13 (see FIG. 2) is placed in a peripheral circuit region PHR on an +X side of the stepwise region STR. The SGD drive circuit 13a is electrically connected to an end portion on an −X side of each of the drive electrode films 61 to 64 extracted to the stepwise region STR' via wiring CW. The SGD drive circuit 13b is electrically connected to an end portion on a +X side of each of the drive electrode films 62 and 63 extracted to the stepwise region STR via the wiring CW. An end portion on a +X side of each of the drive electrode films 61 and 64 extracted to the stepwise region STR is shunt-connected by shunt wiring SNT, but is not connected to the SGD drive circuit 13b.

Herein, as illustrated in FIGS. 4 and 5, the drive electrode films 62 and 63 of the inner string units SU1 and SU2 have a lower pattern density (an occupation rate of drive electrode films in a placement region, i.e., an occupation rate of a conductive material in the placement region) than the drive electrode films 61 and 64 of the outer string units SU0 and SU3. With this, a YZ cross-sectional area of a conductive portion averaged in the X direction in each of the drive electrode films 62 and 63 of the inner string units SU1 and SU2 tends to be smaller than that in each of the drive electrode films 61 and 64 of the outer string units SU0 and SU3. As a result, an RC delay in the drive electrode films 62 and 63 of the inner string units SU1 and SU2 can be relatively larger than an RC delay in the drive electrode films 61 and 64 of the outer string units SU0 and SU3.

Meanwhile, as illustrated in FIG. 7A, the semiconductor storage device 1 is configured so that driving in which a control voltage is applied in the stepwise region STR' on one side (referred to as "one-side driving") is performed with respect to the drive electrode films 61 and 64 of the outer string units SU0 and SU3 in the memory cell array 2. Further, as illustrated in FIG. 7B, the semiconductor storage device 1 is configured so that driving in which a control voltage is applied in the stepwise regions STR and STR' on both sides (referred to as "both-side driving") is performed with respect to the drive electrode films 62 and 63 of the inner string units SU1 and SU2. FIG. 7A illustrates a cross-sectional configuration of the outer string unit SU0, and FIG. 7B illustrates a cross-sectional configuration of the inner string unit SU1. Note that a cross-sectional configuration of the outer string unit SU3 is similar to the cross-sectional configuration illustrated in FIG. 7A, and the cross-sectional configuration of the inner string unit SU2 is similar to the cross-sectional configuration illustrated in FIG. 7B.

As illustrated in FIG. 7A, in the stepwise region STR' on the −X side of the memory cell array region MAR, a conductive layer 32 serving as the wiring CW is connected to the plurality of drive electrode films 61 serving as the selection gates SGD0 via the plurality of contact plugs 31. The conductive layer 32 is electrically connected to the SGD drive circuit 13a (see FIG. 4) via another wiring or the like (for example, via a contact plug PL in the peripheral region PHR'). The conductive layer 32 can be made from a material containing a conductive substance (for example, metal such as tungsten or aluminum) as a main component. The contact plugs 31 can be made from a material containing a conductive substance (for example, metal such as tungsten) as a main component. The interlayer insulating films 8 can be made from a material containing an insulating substance (for example, semiconductor oxide such as silicon oxide) as a main component. Further, in the stepwise region STR on the +X side of the memory cell array region MAR, a conductive layer 34 serving as the shunt wiring SNT connects (shunt-connects) the plurality of drive electrode films 61 to each other via the plurality of contact plugs 31. The conductive layer 34 is not electrically connected to the SGD drive circuit 13b (see FIG. 4). That is, the drive electrode films 61 of the outer string unit SU0 are configured so that a drive voltage can be applied in the stepwise region STR' on the one side (on the −X side) from the SGD drive circuit 13 and are configured to be subjected to one-side driving.

As illustrated in FIG. 7B, in the stepwise region STR' on the −X side of the memory cell array region MAR, the conductive layer 32 serving as the wiring CW is connected to the plurality of drive electrode films 62 serving as the selection gates SGD1 via the plurality of contact plugs 31. The conductive layer 32 is electrically connected to the SGD drive circuit 13a (see FIG. 4) via another wiring or the like (for example, via the contact plug PL in the peripheral region PHR'). Further, in the stepwise region STR on a +X side of a stacked body LMB, the conductive layer 32 serving as the wiring CW is connected to the plurality of drive electrode films 62 serving as the selection gates SGD1 via the plurality of contact plugs 31. The conductive layer 32 is electrically connected to the SGD drive circuit 13b via another wiring or the like (for example, via the contact plug PL in the peripheral region PHR). That is, the drive electrode film 62 of the inner string unit SU1 is configured so that a drive voltage can be applied in the stepwise regions STR and STR' on both the sides (on the −X side and the +X side) from the SGD drive circuit 13 and is configured to be subjected to both-side driving.

For example, when the peripheral circuit 10 receives a writing instruction to the memory cells MT belonging to the outer string unit SU0 from the outside (memory controller), the peripheral circuit 10 notifies the WL drive circuit 11 for acquiring a writing voltage Vpgm.

Then, the SGD drive circuit 13a illustrated in FIG. 4 applies a drive voltage $V_{SGD0}$ having a selection potential $V_{SL}$ to the drive electrode films 61 (selection gates SGD0) in the stepwise region STR' on the one side and applies a drive voltage $V_{SGD4}$ having a non-selection potential $V_{US}$ to the drive electrode films 64 (selection gates SGD4). In the stepwise regions STR and STR' on both the sides, the SGD drive circuits 13a and 13b apply drive voltages $V_{SGD1}$ and $V_{SGD3}$ having the non-selection potential $V_{US}$ to the drive electrode films 62 (selection gates SGD1) and the drive electrode films 63 (selection gates SGD3) serving as the selection gates SGD1 and SGD3, respectively. FIG. 4 illustrates an application operation of a drive voltage to the outer string unit SU0, indicates an active control line with a solid line, and indicates a non-active control line with a broken line.

Further, for example, when the peripheral circuit 10 receives a writing instruction to the memory cells MT belonging to the outer string unit SU3 from the outside, the peripheral circuit 10 notifies the WL drive circuit 11 for acquiring the writing voltage Vpgm.

Then, the SGD drive circuit 13a illustrated in FIG. 4 applies the drive voltage $V_{SGD4}$ having the selection potential $V_{SL}$ to the drive electrode films 64 in the stepwise region STR' on the one side and applies the drive voltage $V_{SGD0}$ having the non-selection potential $V_{US}$ to the drive electrode films 61. The SGD drive circuits 13a and 13b apply the drive voltages $V_{SGD1}$ and $V_{SGD3}$ having the non-selection potential $V_{US}$ to the drive electrode films 62 and 63, respectively, in the stepwise regions STR and STR' on both the sides.

That is, by one-side driving, the selection transistors SDT of the selected outer string unit are turned on, and a potential of each semiconductor channel 42 is set to a potential based on a potential of the bit line BL. Further, by both-side driving, the selection transistors SDT of the non-selected inner string unit are turned off, and each semiconductor channel 42 becomes a floating state. With this, it is possible to reduce an influence of a difference in RC delay between the drive electrode films 61 and 64 corresponding to the outer string units SU0 and SU3 and the drive electrode films 62 and 63 corresponding to the inner string units SU1 and SU2. As a result, an on timing of the selection transistors SDT of the selected outer string unit and an off timing of the selection transistors SDT of the non-selected inner string units can be brought close to each other.

In addition, the WL drive circuit 11 applies the writing voltage Vpgm to conductive layers serving as the word lines based on an address specified by the writing instruction. With this, writing processing is performed with respect to the memory cells MT belonging to the selected outer string unit.

At this time, in the non-selected inner string units, semiconductor channels 42a and 41b in a floating state are coupled with the conductive layers serving as the word lines, and therefore potentials of the semiconductor channels 42 can be increased to a boost potential in response to application of the writing voltage. Thus, information is not written to the memory cells MT.

Further, for example, when the peripheral circuit 10 receives a writing instruction to the memory cells MT belonging to the inner string unit SU1 from the outside, the peripheral circuit 10 notifies the WL drive circuit 11 for acquiring the writing voltage Vpgm.

Then, in the stepwise region STR' on the one side, the SGD drive circuit 13a illustrated in FIG. 4 applies the drive voltages $V_{SGD0}$ and $V_{SGD4}$ having the non-selection potential $V_{US}$ to the drive electrode films 61 and 64, respectively. In the stepwise regions STR and STR' on both the sides, the SGD drive circuits 13a and 13b apply the drive voltage $V_{SGD1}$ having the selection potential $V_{SL}$ to the drive electrode films 62 and apply the drive voltage $V_{SGD3}$ having the non-selection potential $V_{US}$ to the drive electrode films 63.

Further, for example, when the peripheral circuit 10 receives a writing instruction to the memory cells MT belonging to the inner string unit SU2 from the outside, the peripheral circuit 10 notifies the WL drive circuit 11 for acquiring the writing voltage Vpgm.

Then, in the stepwise region STR' on the one side, the SGD drive circuit 13a illustrated in FIG. 4 applies the drive voltages $V_{SGD0}$ and $V_{SGD4}$ having the non-selection potential $V_{US}$ to the drive electrode films 61 and 64, respectively. In the stepwise regions STR and STR' on both the sides, the SGD drive circuits 13a and 13b apply the drive voltage $V_{SGD3}$ having the selection potential $V_{SL}$ to the drive electrode films 63 and apply the drive voltage $V_{SGD1}$ having the non-selection potential $V_{US}$ to the drive electrode films 62.

That is, by one-side driving, the selection transistors SDT of the non-selected outer string unit are turned off, and each semiconductor channel 42 becomes a floating state. Further, by both-side driving, the selection transistors SDT of the selected inner string unit are turned on, and the potential of each semiconductor channel 42 is set to a potential based on a potential of the bit line BL. With this, it is possible to reduce an influence of a difference in RC delay between the drive electrode films 61 and 64 corresponding to the outer string units SU0 and SU3 and the drive electrode films 62 and 63 corresponding to the inner string units SU1 and SU2. As a result, an off timing of the selection transistors SDT of the non-selected outer string units and an on timing of the selection transistors SDT of the selected inner string unit can be brought close to each other.

In addition, the WL drive circuit 11 applies the writing voltage Vpgm to conductive layers serving as the word lines based on an address specified by the writing instruction. With this, writing processing is performed with respect to the memory cells MT belonging to the selected inner string unit.

At this time, in the plurality of non-selected outer string units, the semiconductor channels 42 in a floating state are coupled with the conductive layers serving as the word lines, and therefore the potentials of the semiconductor channels 42 can be increased to a boost potential in response to application of the writing voltage. Thus, information is not written to the memory cells MT.

Figure 8A:
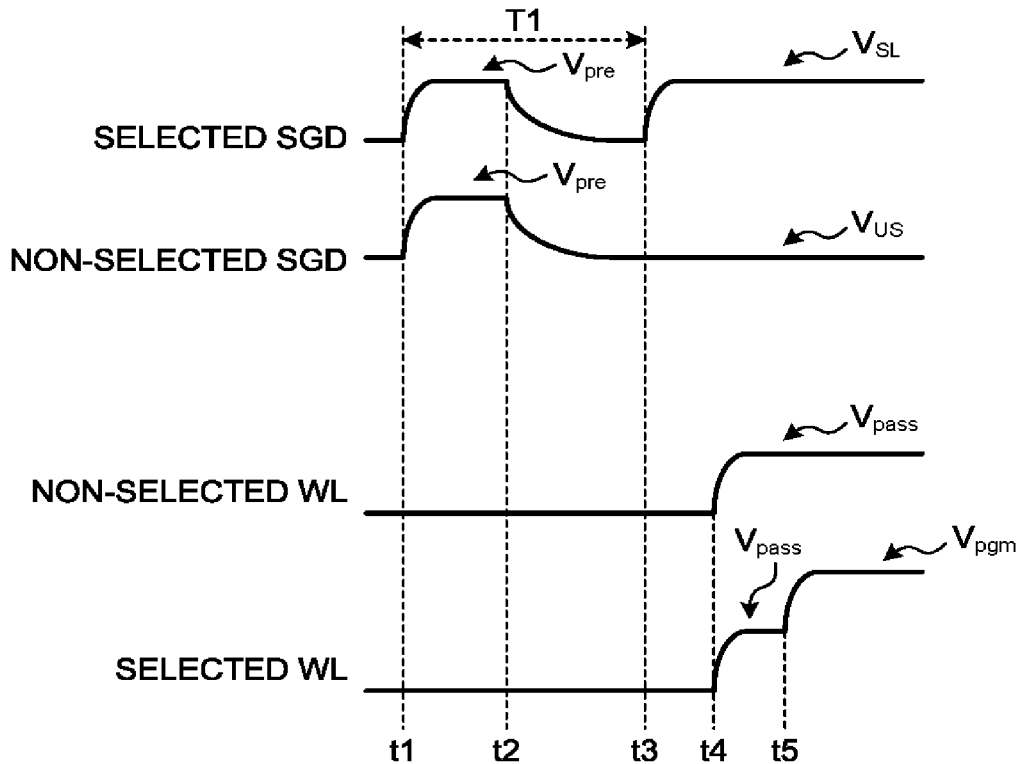
FIGS. 8A and 8B are timing charts illustrating application timings of a drive voltage to the memory cell array included in the semiconductor storage device according to the first embodiment.
Figure 8B:
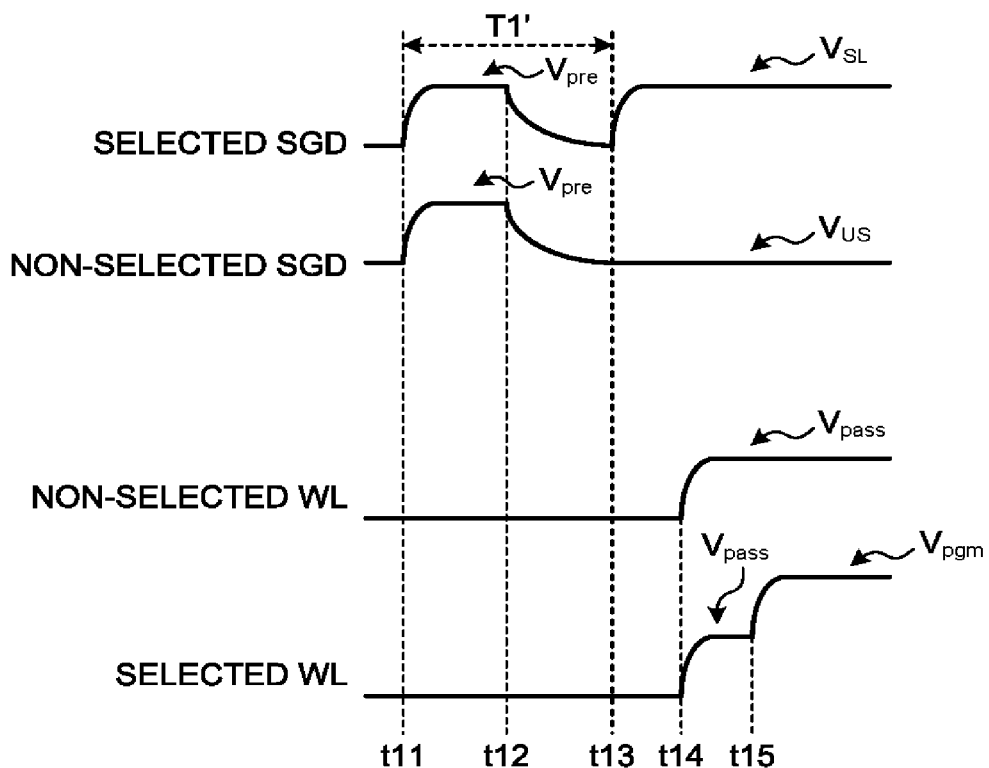

Further, as illustrated in FIGS. 8A and 8B, in order to increase driving speed, the SGD drive circuit 13 may perform precharge with respect to each of the drive electrode films 61 to 64 before a timing at which driving is started.

For example, in a case where the plurality of outer string units SU0 is driven, i.e., in a case where a selected SGD is the drive electrode films 61, as illustrated in FIG. 8A, precharge may be performed with respect to each of the drive electrode films 61 to 64 before a timing t3 at which driving is started. FIG. 8A is a waveform chart illustrating an application operation of a drive voltage to the plurality of outer string units SU0.

At a timing t1, when the SGD drive circuit 13 applies a precharge potential Vpre to the drive electrode films 61 and 64 by one-side driving and applies the precharge potential Vpre to the drive electrode films 62 and 63 by both-side driving, the selection transistors SDT in each of the string units SU0 to SU3 are turned on.

At a timing t2, when the SGD drive circuit 13 applies the non-selection potential $V_{US}$ to the drive electrode films 61 and 64 by one-side driving and applies the non-selection potential $V_{US}$ to the drive electrode films 62 and 63 by both-side driving, the selection transistors SDT of each of the string units SU0 to SU3 are turned off.

At the timing t3, the SGD drive circuit 13 applies the selection potential $V_{SL}$ to the drive electrode films 61 by one-side driving, applies the non-selection potential $V_{US}$ to the drive electrode films 64 by one-side driving, applies the non-selection potential $V_{US}$ to the drive electrode films 62 and 63 by both-side driving, and starts driving the drive electrode films 61 serving as the selected SGD. In response to this, when potentials of the drive electrode films 61 are increased from the non-selection potential $V_{US}$ to the selection potential $V_{SL}$, the selection transistors SDT of the outer string units SU0 are turned on, and the potential of each semiconductor channel 42 is set to a potential based on the potential of the bit line BL.

At a timing t4, the WL drive circuit 11 applies a transfer potential Vpass that is lower than the writing voltage Vpgm and is higher than a threshold voltage to both the conductive layers serving as the non-selected word lines and the conductive layers serving as the selected word lines and forms a channel for charges in each semiconductor channel 42 so that the charges are transferred.

At a timing t5, the WL drive circuit 11 selectively applies the writing voltage Vpgm to the conductive layers serving as the selected word lines so that information is written to selected memory cells MT.

As illustrated in FIG. 8A, a long precharge period T1 is secured because the drive electrode films serving as the selected SGD are the drive electrode films 61 of the plurality of outer string units SU0 subjected to one-side driving.

Further, for example, in a case where the plurality of inner string units SU1 is driven, i.e., in a case where the selected SGD is the drive electrode films 62, as illustrated in FIG. 8B, precharge may be performed with respect to each of the drive electrode films 61 to 64 before a timing t13 at which driving is started. FIG. 8B is a waveform chart illustrating an application operation of a drive voltage to the inner string units SU1.

At a timing t11, when the SGD drive circuit 13 applies the precharge potential Vpre to the drive electrode films 61 and 64 by one-side driving and applies the precharge potential Vpre to the drive electrode films 62 and 63 by both-side driving, the selection transistors SDT in each of the string units SU0 to SU3 are turned on.

At a timing t12, when the SGD drive circuit 13 applies the non-selection potential $V_{US}$ to the drive electrode films 61 and 64 by one-side driving and applies the non-selection potential $V_{US}$ to the drive electrode films 62 and 63 by both-side driving, the selection transistors SDT of each of the string units SU0 to SU3 are turned off.

At the timing t13, the SGD drive circuit 13 applies the non-selection potential $V_{US}$ to the drive electrode films 61 and 64 by one-side driving, applies the selection potential $V_{SL}$ to the drive electrode films 62 by both-side driving, applies the non-selection potential $V_{US}$ to the drive electrode films 63 by both-side driving, and starts driving the drive electrode films 62 serving as the selected SGD. In response to this, when potentials of the drive electrode films 62 are increased from the non-selection potential $V_{US}$ to the selection potential $V_{SL}$, the selection transistors SDT of the inner string unit SU1 are turned on, and the potential of each semiconductor channel 42 is set to a potential based on the potential of the bit line BL.

At a timing t14, the WL drive circuit 11 applies the transfer potential Vpass that is lower than the writing voltage Vpgm and is higher than the threshold voltage to both the conductive layers serving as the non-selected word lines and the conductive layers serving as the selected word lines and forms a channel for charges in each semiconductor channel 42 so that the charges are transferred.

At a timing t15, the WL drive circuit 11 selectively applies the writing voltage Vpgm to the conductive layers serving as the selected word lines so that information is written to selected memory cells MT.

As illustrated in FIG. 8B, a precharge period T1' can be shorter than the precharge period T1 illustrated in FIG. 8A because the drive electrode films serving as the selected SGD are the drive electrode films 62 of the inner string units SU1 subjected to both-side driving.

As described above, in the semiconductor storage device 1, one-side driving in which a control voltage is applied in the stepwise region STR' on the one side is performed with respect to the drive electrode films 61 and 64 of the outer string units SU0 and SU3 in the memory cell array 2. Further, both-side driving in which a control voltage is applied in the stepwise regions STR and STR' on both the sides is performed with respect to the drive electrode films 62 and 63 of the inner string units SU1 and SU2. With this, it is possible to restrain the number of lines in a wiring layer from being increased and simplify a control peripheral circuit, as compared to a case where all the drive electrode films are subjected to both-side driving. This makes it possible to restrain a circuit area of the semiconductor storage device 1 from being increased. Further, it is possible to advance start timings of driving of writing processing and the like as a whole, as compared to a case where all the drive electrode films are subjected to one-side driving. This makes it possible to improve driving performance of the writing processing and the like in the semiconductor storage device 1. Therefore, it is possible to easily achieve both restraint in increase in the circuit area and improvement in driving performance in the semiconductor storage device 1.

Note that, in FIG. 4, there has been described a case where the drive electrode films of the outer string units are subjected to one-side driving in the stepwise region STR' on the −X side. However, the drive electrode films of the outer string units may be subjected to one-side driving in the stepwise region STR on the +X side. In this case, the plurality of contact plugs 31 connected to the end portions on the +X side of the drive electrode films of the outer string units extracted to the stepwise region STR on the +X side is connected to each other by shunt wiring and is not connected to the SGD drive circuit 13a. The contact plugs 31 connected to the end portions on the −X side of the drive electrode films of the outer string units extracted to the stepwise region STR' on the −X side are electrically connected to the SGD drive circuit 13b via the wiring CW. Also in this configuration, it is possible to achieve an effect similar to that of the embodiment.

Figure 9:
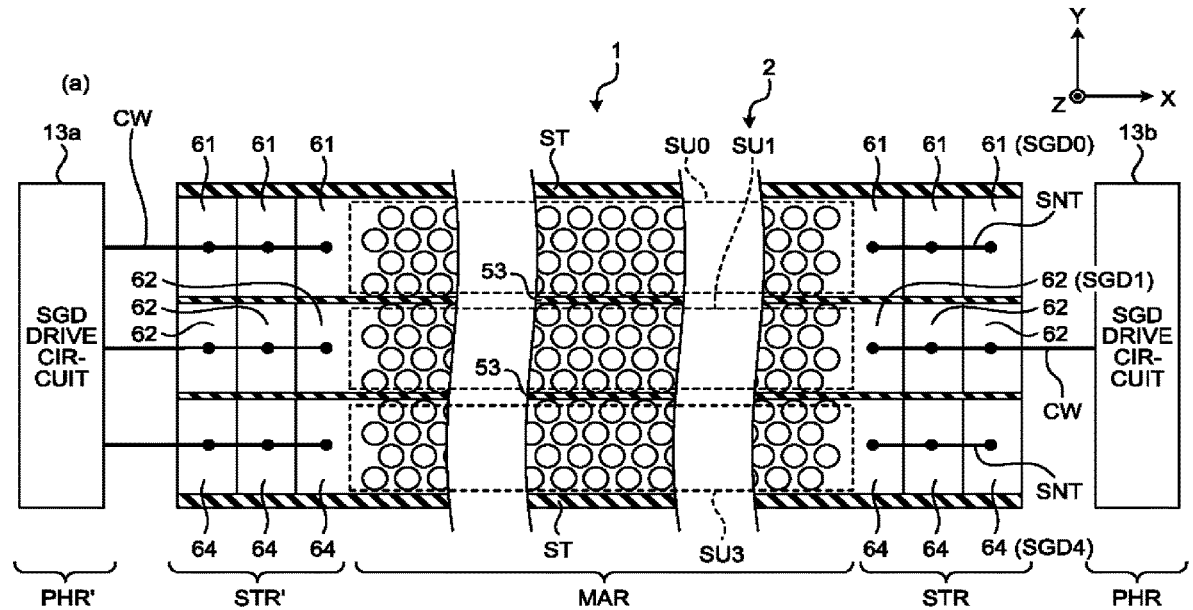
FIG. 9 illustrates driving of a memory cell array included in a first modification example of the semiconductor storage device according to the first embodiment.

Alternatively, the number of inner string units in the memory cell array 2 may be one. For example, as a first modification example of the first embodiment, as illustrated in FIG. 9, the plurality of columnar bodies 4 may be placed to form, for example, twelve lanes in the XY plan view in the semiconductor storage device 1. FIG. 9 illustrates driving of the memory cell array included in the first modification example of the semiconductor storage device according to the first embodiment. The memory cell array 2 illustrated in FIG. 9 is configured by omitting the string unit SU2 and the drive electrode films 63 (selection gates SGD3) illustrated in FIG. 4.

Also in this configuration, one-side driving in which a control voltage is applied in the stepwise region STR' on the one side is performed with respect to the drive electrode films 61 and 64 of the outer string units SU0 and SU3 in the memory cell array 2. Further, both-side driving in which a control voltage is applied in the stepwise regions STR and STR' on both the sides is performed with respect to the drive electrode films 62 of the inner string unit SU1. With this, it is possible to restrain the number of lines of the wiring layer from being increased and simplify the control peripheral circuit, as compared to a case where all the drive electrode films are subjected to both-side driving. This makes it possible to restrain a circuit area of the semiconductor storage device 1 from being increased. Further, it is possible to advance start timings of driving of writing processing and the like as a whole, as compared to a case where all the drive electrode films are subjected to one-side driving. This makes it possible to improve driving performance of the writing processing and the like in the semiconductor storage device 1.

Figure 10:
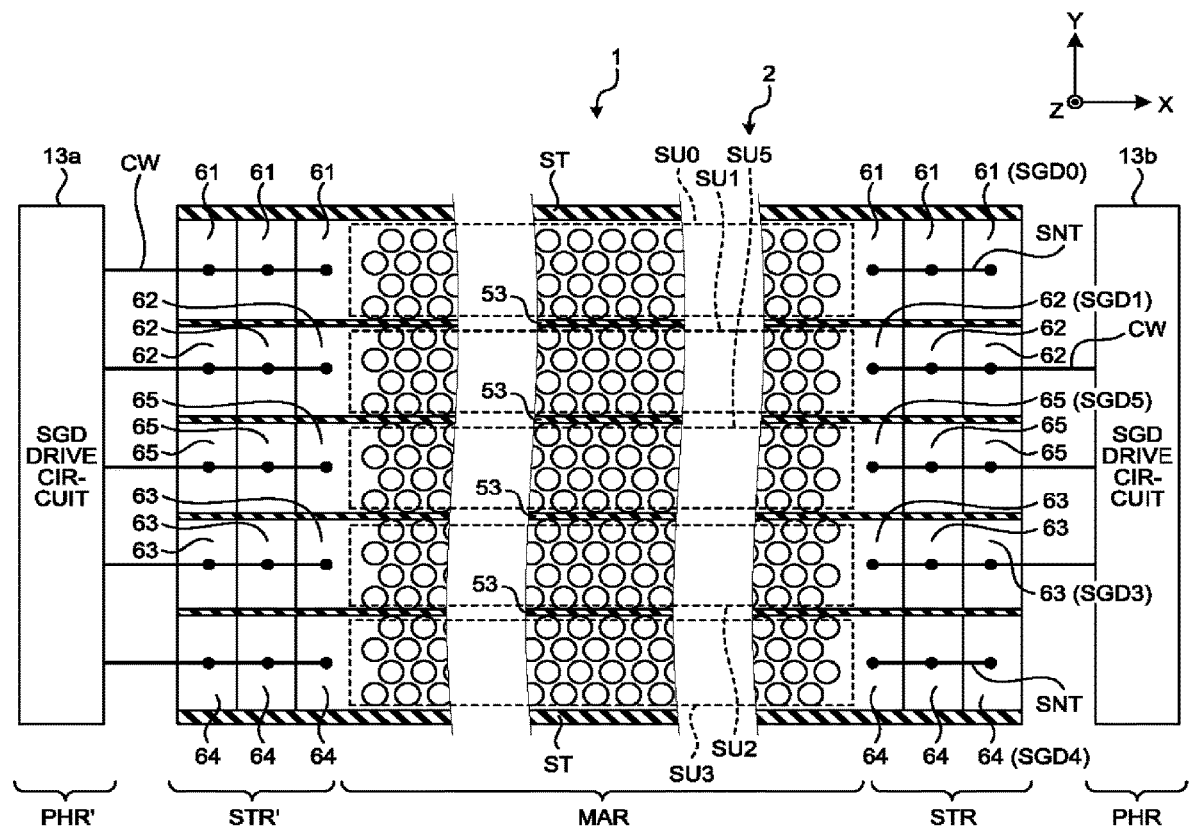
FIG. 10 illustrates driving of a memory cell array included in a second modification example of the semiconductor storage device according to the first embodiment.

Alternatively, the number of inner string units in the memory cell array 2 may be more than two. For example, as a second modification example of the first embodiment, as illustrated in FIG. 10, the plurality of columnar bodies 4 may be placed to form, for example, twenty lanes in the XY plan view in the semiconductor storage device 1. FIG. 10 illustrates driving of the memory cell array included in the second modification example of the semiconductor storage device according to the first embodiment. The memory cell array 2 illustrated in FIG. 10 is configured by adding a string unit SU5 between the string unit SU1 and the string unit SU2 illustrated in FIG. 4 and adding drive electrode films 65 (selection gates SGD5) between the drive electrode films 62 (selection gates SGD1) and the drive electrode films 63 (selection gates SGD3).

Also in this configuration, one-side driving in which a control voltage is applied in the stepwise region STR' on the one side is performed with respect to the drive electrode films 61 and 64 of the outer string units SU0 and SU3 in the memory cell array 2. Further, both-side driving in which a control voltage is applied in the stepwise regions STR and STR' on both the sides is performed with respect to the drive electrode films 62 and 63 of the inner string units SU1 and SU2 and the drive electrode films 65 of the innermost string unit SU5. With this, it is possible to restrain the number of lines of the wiring layer from being increased and simplify the control peripheral circuit, as compared to a case where all the drive electrode films are subjected to both-side driving. This makes it possible to restrain a circuit area of the semiconductor storage device 1 from being increased. Further, it is possible to advance start timings of driving of writing processing and the like as a whole, as compared to a case where all the drive electrode films are subjected to one-side driving. This makes it possible to improve driving performance of the writing processing and the like in the semiconductor storage device 1.

Figure 11A:
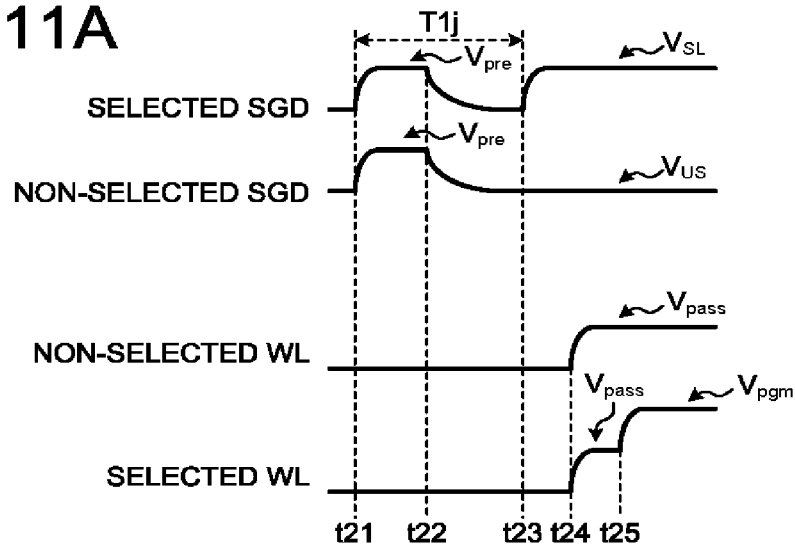
FIGS. 11A to 11C are timing charts illustrating application timings of a drive voltage to the memory cell array included in the second modification example of the semiconductor storage device according to the first embodiment.
Figure 11B:
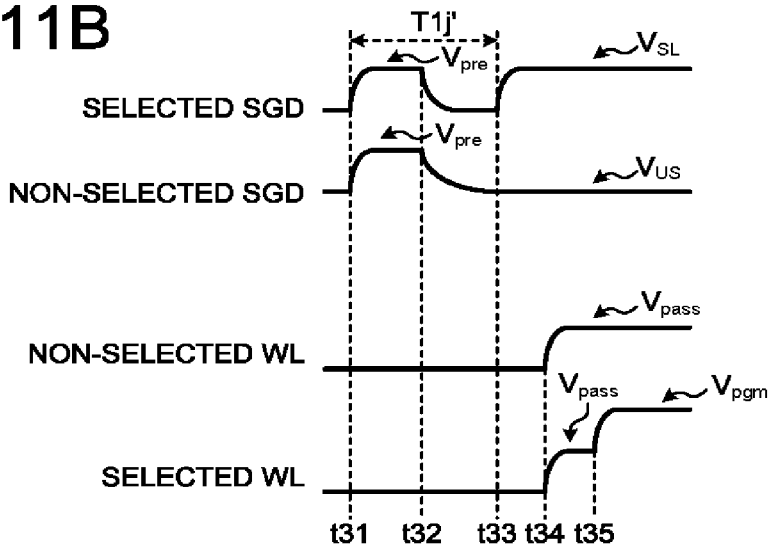
Figure 11C:
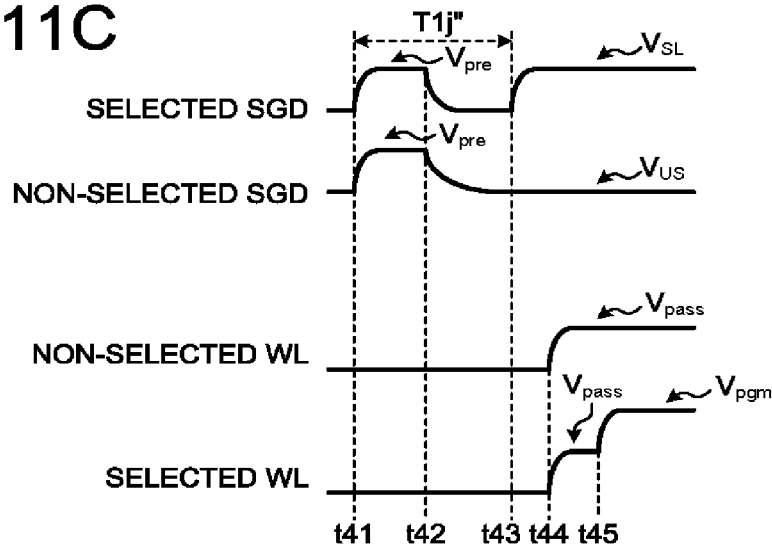

Alternatively, as illustrated in FIGS. 11A to 11C, in order to increase the driving speed, the SGD drive circuit 13 may perform precharge with respect to each of the drive electrode films 61, 62, 65, 63, and 64 before a timing at which driving is started. Further, at this time, the plurality of string units SU0, SU1, SU5, SU2, and SU3 may be driven in multi-stages. FIGS. 11A to 11C are timing charts illustrating application timings of a drive voltage to the memory cell array included in the second modification example of the semiconductor storage device 1 according to the first embodiment.

For example, in a case where the outer string unit SU0 is driven, i.e., in a case where the selected SGD is the drive electrode films 61, as illustrated in FIG. 11A, precharge may be performed with respect to each of the drive electrode films 61, 62, 65, 63, and 64 before a timing t23 at which driving is started. FIG. 11A is a waveform chart illustrating an application operation of a drive voltage to the plurality of outer string units SU0.

At a timing t21, when the SGD drive circuit 13 applies the precharge potential Vpre to the drive electrode films 61 and 64 by one-side driving and applies the precharge potential Vpre to the drive electrode films 62, 65, and 63 by both-side driving, the selection transistors SDT in each of the string units SU0, SU1, SU5, SU2, and SU3 are turned on.

At a timing t22, when the SGD drive circuit 13 applies the non-selection potential $V_{US}$ to the drive electrode films 61 and 64 by one-side driving and applies the non-selection potential $V_{US}$ to the drive electrode films 62, 65, and 63 by both-side driving, the selection transistors SDT of each of the string units SU0, SU1, SU5, SU2, and SU3 are turned off.

At the timing t23, the SGD drive circuit 13 applies the selection potential $V_{SL}$ to the drive electrode films 61 by one-side driving, applies the non-selection potential $V_{US}$ to the drive electrode films 64 by one-side driving, and applies the non-selection potential $V_{US}$ to the drive electrode films 62, 65, and 63 by both-side driving. With this, driving of the drive electrode films 61 serving as the selected SGD is started. In response to this, when the potentials of the drive electrode films 61 are increased from the non-selection potential $V_{US}$ to the selection potential $V_{SL}$, the selection transistors SDT of the outer string units SU0 are turned on, and the potential of each semiconductor channel 42 is set to a potential based on the potential of the bit line BL.

At a timing t24, the WL drive circuit 11 applies the transfer potential Vpass that is lower than the writing voltage Vpgm and is higher than the threshold voltage to both the conductive layers serving as the non-selected word lines and the conductive layers serving as the selected word lines and forms a channel for charges in each semiconductor channel 42 so that the charges are transferred.

At a timing t25, the WL drive circuit 11 selectively applies the writing voltage Vpgm to the conductive layers serving as the selected word lines so that information is written to selected memory cells MT.

As illustrated in FIG. 11A, a long precharge period T1$j$ is secured because the drive electrode films serving as the selected SGD are the drive electrode films 61 of the plurality of outer string units SU0 subjected to one-side driving.

Further, for example, in a case where the inner string unit SU1 is driven, i.e., in a case where the selected SGD is the drive electrode films 62, as illustrated in FIG. 11B, precharge may be performed with respect to each of the drive electrode films 61, 62, 65, 63, and 64 before a timing t33 at which driving is started. FIG. 11B is a waveform chart illustrating an application operation of a drive voltage to the inner string unit SU1.

At a timing t31, when the SGD drive circuit 13 applies the precharge potential Vpre to the drive electrode films 61 and 64 by one-side driving and applies the precharge potential Vpre to the drive electrode films 62, 65, and 63 by both-side driving, the selection transistors SDT in each of the string units SU0, SU1, SU5, SU2, and SU3 are turned on.

At a timing t32, when the SGD drive circuit 13 applies the non-selection potential $V_{US}$ to the drive electrode films 61 and 64 by one-side driving and applies the non-selection potential $V_{US}$ to the drive electrode films 62, 65, and 63 by both-side driving, the selection transistors SDT of each of the string units SU0, SU1, SU5, SU2, and SU3 are turned off.

At the timing t33, the SGD drive circuit 13 applies the non-selection potential $V_{US}$ to the drive electrode films 61 and 64 by one-side driving, applies the non-selection potential $V_{US}$ to the drive electrode films 63 and 65 by both-side driving, and applies the selection potential $V_{SL}$ to the drive electrode films 62 by both-side driving. With this, driving of the drive electrode films 62 serving as the selected SGD is started. In response to this, when the potentials of the drive electrode films 62 are increased from the non-selection potential $V_{US}$ to the selection potential $V_{SL}$, the selection transistors SDT of the inner string unit SU1 are turned on, and the potential of each semiconductor channel 42 is set to a potential based on the potential of the bit line BL.

At a timing t34, the WL drive circuit 11 applies the transfer potential Vpass that is lower than the writing voltage Vpgm and is higher than the threshold voltage to both the conductive layers serving as the non-selected word lines and the conductive layers serving as the selected word lines and forms a channel for charges in each semiconductor channel 42 so that the charges are transferred.

At a timing t35, the WL drive circuit 11 selectively applies the writing voltage Vpgm to the conductive layers serving as the selected word lines so that information is written to selected memory cells MT.

As illustrated in FIG. 11B, a precharge period T1$j'$ can be shorter than the precharge period T1$j$ illustrated in FIG. 11A because the drive electrode films serving as the selected SGD are the drive electrode films 62 of the inner string unit SU1 subjected to both-side driving.

Further, for example, in a case where the plurality of innermost string units SU5 is driven, i.e., in a case where the selected SGD is the drive electrode films 65, as illustrated in FIG. 11C, precharge may be performed with respect to each of the drive electrode films 61, 62, 65, 63, and 64 before a timing t43 at which driving is started. FIG. 11C is a waveform chart illustrating an application operation of a drive voltage to the innermost string units SU5.

At a timing t41, when the SGD drive circuit 13 applies the precharge potential Vpre to the drive electrode films 61 and 64 by one-side driving and applies the precharge potential Vpre to the drive electrode films 62, 65, and 63 by both-side driving, the selection transistors SDT in each of the string units SU0, SU1, SU5, SU2, and SU3 are turned on.

At a timing t42, when the SGD drive circuit 13 applies the non-selection potential $V_{US}$ to the drive electrode films 61 and 64 by one-side driving and applies the non-selection potential $V_{US}$ to the drive electrode films 62, 65, and 63 by both-side driving, the selection transistors SDT of each of the string units SU0, SU1, SU5, SU2, and SU3 are turned off.

At the timing t43, the SGD drive circuit 13 applies the non-selection potential $V_{US}$ to the drive electrode films 61 and 64 by one-side driving, applies the non-selection potential $V_{US}$ to the drive electrode films 62 and 63 by both-side driving, and applies the selection potential $V_{SL}$ to the drive electrode films 65 by both-side driving. With this, driving of the drive electrode films 65 serving as the selected SGD is started. In response to this, when potentials of the drive electrode films 65 are increased from the non-selection potential $V_{US}$ to the selection potential $V_{SL}$, the selection transistors SDT of the innermost string units SU5 are turned on, and the potential of each semiconductor channel 42 is set to a potential based on the potential of the bit line BL.

At a timing t44, the WL drive circuit 11 applies the transfer potential Vpass that is lower than the writing voltage Vpgm and is higher than the threshold voltage to both the conductive layers serving as the non-selected word lines and the conductive layers serving as the selected word lines and forms a channel for charges in each semiconductor channel 42 so that the charges are transferred.

At a timing t45, the WL drive circuit 11 selectively applies the writing voltage Vpgm to the conductive layers serving as the selected word lines so that information is written to selected memory cells MT.

As illustrated in FIG. 11C, a precharge period T1$j''$ can be shorter than the precharge period T1$j$ illustrated in FIG. 11A because the drive electrode films serving as the selected SGD are the drive electrode films 65 of the innermost string units SU5 subjected to both-side driving. Further, the precharge period T1$j''$ can be slightly longer than the precharge period T1$j'$ illustrated in FIG. 11B for a reason of a process. The reason of the process is that, for example, because an embedding rate of the conductive material in the drive electrode films of the innermost string units is relatively lower than an embedding rate of the conductive material in the drive electrode films of the inner string units in some cases, a pattern density of the drive electrode films of the innermost string units can be smaller than a pattern density of the drive electrode films of the inner string units.

In a case where the number of inner string units in the stacked body LMB is more than two as described above, by changing the precharge period in multi-stages, it is possible to further advance start timings of driving of writing processing and the like as a whole, as compared to a case where all the drive electrode films are subjected to one-side driving.

Further, a magnitude relation among the precharge period T1$j$ of the outer string unit, the precharge period T1$j'$ of the inner string unit, and the precharge period T1$j''$ of the outermost string unit illustrated in FIGS. 11A to 11C (T1$j$>T1$j''$>T1$j'$) is merely an example and may be another magnitude relation. For example, T1$j$<T1$j'$<T1$j''$ may be satisfied. Also in this case, by changing the precharge period in multi-stages, it is possible to further advance start timings of driving of writing processing and the like as a whole, as compared to a case where all the drive electrode films are subjected to one-side driving.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a plurality of first conductive layers stacked in a first direction;
   a second conductive layer placed in the first direction of the plurality of first conductive layers;
   a first separation film separating the plurality of first conductive layers and the second conductive layer in a second direction, the second direction crossing the first direction, the first separation film extending in the first direction and a third direction, the third direction crossing the first direction and the second direction, lower edge of the first separation film being located at lower position in the first direction than the plurality of first conductive layers;
   a second separation film placed on an opposite side of the first separation film in the second direction with respect to the plurality of first conductive layers, the second separation film separating the plurality of first conductive layers and the second conductive layer in the second direction, the second separation film extending in the first direction and the third direction, a lower edge of the second separation film being located at lower position in the first direction than the plurality of first conductive layers;
   a third separation film placed between the first separation film and the second separation film in the second direction, the third separation film separating the second conductive layer in the second direction, the third separation film extending in the first direction and the third direction, a lower edge of the third separation film being located at higher position in the first direction than the plurality of first conductive layers;
   a fourth separation film placed between the third separation film and the second separation film in the second direction, the fourth separation film separating the second conductive layer in the second direction, the fourth separation film extending in the first direction and the third direction, lower edge of the fourth separation film being located at higher position in the first direction than the plurality of first conductive layers;
   a first semiconductor pillar extending in the first direction in a first region of the second conductive layer arranged between the first separation film and the third separation film;
   a second semiconductor pillar extending in the first direction in a second region of the second conductive layer arranged between the third separation film and the fourth separation film;
   a first charge storage layer placed between the first semiconductor pillar and the plurality of first conductive layers;
   a second charge storage layer placed between the second semiconductor pillar and the plurality of first conductive layers;
   a first drive circuit electrically connected to the first region and the second region in the third direction;
   a second drive circuit electrically connected to the second region in the third direction, the second drive circuit being not electrically connected to the first region.

2. The semiconductor storage device according to claim 1, wherein
   an occupation rate of a conductive material in the second region is lower than an occupation rate of a conductive material in the first region.

3. The semiconductor storage device according to claim 1, wherein
   an RC delay in the second region is larger than an RC delay in the first region.

4. The semiconductor storage device according to claim 1, wherein
   a cross-sectional area of the second region vertical to the third direction averaged in the third direction is smaller than a cross-sectional area of the first region vertical to the third direction averaged in the third direction.

5. The semiconductor storage device according to claim 1, wherein
   the second drive circuit is placed on an opposite side of the first drive circuit in the third direction with respect to the second conductive layer.

6. The semiconductor storage device according to claim 5, further comprising
   a first contact plug electrically connected between the first region and the first drive circuit;
   a second contact plug electrically connected between the second region and the first drive circuit; and
   a third contact plug electrically connected between the second region and the second drive circuit; and
   a fourth contact plug electrically connected to the first region, the fourth contact plug being not electrically connected to the second drive circuit.

7. The semiconductor storage device according to claim 6, further comprising:
   a first wiring electrically connected between the first contact plug and the first drive circuit;
   a second wiring electrically connected between the second contact plug and the first drive circuit; and
   a third wiring electrically connected between the third contact plug and the second drive circuit.

8. The semiconductor storage device according to claim 6, wherein
   the semiconductor storage device includes a plurality of the first contact plugs, a plurality of the second contact plugs, a plurality of the third contact plugs, and a plurality of the fourth contact plugs, and
   the semiconductor storage device further includes
   a first wiring electrically connected between the plurality of first contact plugs and the first drive circuit,
   a second wiring electrically connected between the plurality of second contact plugs and the first drive circuit,
   a third wiring electrically connected between the plurality of third contact plugs and the second drive circuit, and
   a shunt wiring electrically connected to the plurality of fourth contact plugs.

9. The semiconductor storage device according to claim 1, further comprising:

a fifth separation film placed between the fourth separation film and the second separation film in the second direction, the fifth separation film separating the second conductive layer in the second direction, the fifth separation film extending in the first direction and the third direction;

a third semiconductor pillar extending in the first direction in a third region arranged between the fourth separation film;

a third charge storage layer placed between the third semiconductor pillar and the plurality of first conductive layers.

10. The semiconductor storage device according to claim 9, wherein
an occupation rate of a conductive material in the third region is lower than an occupation rate of a conductive material in the second region, and
an occupation rate of a conductive material in the second region is lower than an occupation rate of a conductive material in the first region.

11. The semiconductor storage device according to claim 9, wherein
an RC delay in the third region is larger than an RC delay in the second region, and
an RC delay in the second region is larger than an RC delay in the first region.

12. The semiconductor storage device according to claim 9, wherein
a cross-sectional area of the third region vertical to the third direction averaged in the third direction is smaller than a cross-sectional area of the second region vertical to the third direction averaged in the third direction, and
a cross-sectional area of the second region vertical to the third direction averaged in the third direction is smaller than the cross-sectional area of the first region vertical to the third direction averaged in the third direction.

13. The semiconductor storage device according to claim 9, wherein
the second drive circuit is placed on an opposite side of the first drive circuit in the third direction with respect to the second conductive layer.

14. The semiconductor storage device according to claim 9, further comprising
a first contact plug electrically connected between the first region and the first drive circuit;
a second contact plug electrically connected between the second region and the first drive circuit;
a third contact plug electrically connected between the second region and the second drive circuit;
a fourth contact plug electrically connected to the first region, the fourth contact plug being not electrically connected to the second drive circuit;
a fifth contact plug electrically connected between the third region and the first drive circuit; and
a sixth contact plug electrically connected between the third region and the second drive circuit.

15. The semiconductor storage device according to claim 9, further comprising:
a first wiring electrically connected between the first contact plug and the first drive circuit;
a second wiring electrically connected between the second contact plug and the first drive circuit; and
a third wiring electrically connected between the third contact plug and the second drive circuit;
a fourth wiring electrically connected between the fifth contact plug and the first drive circuit; and
a fifth wiring electrically connected between the sixth contact plug and the second drive circuit.

16. The semiconductor storage device according to claim 14, wherein
the semiconductor storage device includes a plurality of the first contact plugs, a plurality of the second contact plugs, a plurality of the third contact plugs, a plurality of the fourth contact plugs, a plurality of the fifth contact plugs, and a plurality of the sixth contact plugs, and
the semiconductor storage device further includes
a first wiring electrically connected between the plurality of first contact plugs and the first drive circuit,
a second wiring electrically connected between the plurality of second contact plugs and the first drive circuit,
a third wiring electrically connected between the plurality of third contact plugs and the second drive circuit,
a fourth wiring electrically connected between the plurality of fifth contact plugs and the first drive circuit,
a fifth wiring electrically connected between the plurality of sixth contact plugs and the second drive circuit, and
a shunt wiring electrically connected to the plurality of fourth contact plugs.

17. The semiconductor storage device according to claim 1, wherein
the first drive circuit performs precharge with respect to the first region during first period, and
the first drive circuit and the second drive circuit perform precharge with respect to the second region during second period that is different from the first period.

18. The semiconductor storage device according to claim 17, wherein
the first period is shorter than the second period.

19. The semiconductor storage device according to claim 9, wherein
the first drive circuit performs precharge with respect to the first region during first period, and
the first drive circuit and the second drive circuit perform precharge with respect to the second region during second period that is different from the first period and perform precharge with respect to the third region during third period that is different from the first period or the second period.

20. The semiconductor storage device according to claim 19, wherein
the second period is shorter than the first period, and
the third period is longer than the second period.

* * * * *